United States Patent
Lin

(10) Patent No.: US 8,426,914 B2
(45) Date of Patent: Apr. 23, 2013

(54) SEMICONDUCTOR DEVICE INTEGRATED WITH CONVERTER AND PACKAGE STRUCTURE THEREOF

(75) Inventor: Wei-Chieh Lin, Hsinchu (TW)

(73) Assignee: Sinopower Semiconductor Inc., Hsinchu (TW)

( * ) Notice: Subject to any disclaimer, the term of this patent is extended or adjusted under 35 U.S.C. 154(b) by 95 days.

(21) Appl. No.: 13/013,832

(22) Filed: Jan. 26, 2011

(65) Prior Publication Data

US 2012/0056277 A1 Mar. 8, 2012

(30) Foreign Application Priority Data

Sep. 2, 2010 (TW) ................................ 99129674 A

(51) Int. Cl.
H01L 29/00 (2006.01)
(52) U.S. Cl.
USPC .......................................... 257/334; 257/438
(58) Field of Classification Search .................. 257/334, 257/438, E29.256; 327/438; 438/669
See application file for complete search history.

(56) References Cited

U.S. PATENT DOCUMENTS

| | | | |
|---|---|---|---|
| 6,552,390 B2 | 4/2003 | Kameda | |
| 7,109,577 B2 | 9/2006 | Shiraishi | |
| 7,138,698 B2 | 11/2006 | Nakamura | |
| 7,250,672 B2 | 7/2007 | Pavier | |
| 7,259,459 B2 * | 8/2007 | Kameda et al. | 257/724 |
| 7,375,029 B2 | 5/2008 | Poelzl | |
| 7,439,771 B2 * | 10/2008 | Ludikhuize et al. | 326/68 |
| 7,459,750 B2 | 12/2008 | Ludikhuize | |
| 7,566,931 B2 * | 7/2009 | Kocon | 257/328 |
| 7,768,075 B2 * | 8/2010 | Yilmaz et al. | 257/401 |
| 2011/0000636 A1 * | 1/2011 | Streubel et al. | 164/423 |

* cited by examiner

Primary Examiner — Howard Weiss
Assistant Examiner — Steven Rao
(74) Attorney, Agent, or Firm — Winston Hsu; Scott Margo

(57) ABSTRACT

The present invention provides a semiconductor device including a semiconductor substrate having a first conductive type, at least one high-side transistor device and at least one low-side transistor device. The high-side transistor device includes a doped high-side base region having a second conductive type, a doped high-side source region having the first conductive type and a doped drain region having the first conductive type. The doped high-side base region is disposed within the semiconductor substrate, and the doped high-side source region and the doped drain region are disposed within the doped high-side base region. The doped high-side source region is electrically connected to the semiconductor substrate, and the semiconductor substrate is regarded as a drain of the low-side transistor device.

21 Claims, 14 Drawing Sheets

SEMICONDUCTOR DEVICE INTEGRATED WITH CONVERTER AND PACKAGE STRUCTURE THEREOF

BACKGROUND OF THE INVENTION

1. Field of the Invention

The present invention relates to a semiconductor device and a package structure thereof, and more particularly, a semiconductor device integrated with a converter and a package structure thereof.

2. Description of the Prior Art

Electronic devices usually include various components, and each component has its own operation voltage. Therefore, DC-DC voltage converters are required in electronic devices to change the voltage level (step up or step down) and maintain the required voltage supply stable. Due to different demands for power source, the DC-DC converters develop into many different types originally from the Buck/Step Down converter and the Boost/Step Up converter.

The conventional Buck converter is composed of a high-side NMOSFET device and a low-side NMOSFET device. The high-side NMOSFET device and the low-side NMOSFET device are usually disposed in the same package structure for being electrically connected to the circuit board.

Please refer to FIG. 1. FIG. 1 illustrates a schematic diagram of a package structure of a conventional Buck converter. As shown in FIG. 1, the package structure 10 of the conventional Buck converter includes a lead frame 12, a high-side NMOSFET device 14, a low-side NMOSFET device 16, a Schottky diode 18 and a sealant 20. The lead frame 12 includes a first lead 12a, a second lead 12b, a third lead 12c, a fourth lead 12d, a fifth lead 12e, a sixth lead 12f, a seventh lead 12g, an eighth lead 12h, a first chip holder 12i and a second chip holder 12j. The first lead 12a and the second lead 12b are connected to the first chip holder 12i, while the fifth lead 12e, the sixth lead 12f, and the seventh lead 12g are connected to the second chip holder 12j. The high-side NMOSFET device 14 is disposed on the first chip holder 12i, in which a drain of the high-side NMOSFET device 14 is electrically connected to the first chip holder 12i, and a source 14b and a gate 14c of the high-side NMOSFET device 14 are respectively electrically connected to the seventh lead 12g and the eighth lead 12h by means of metal wires 22. Furthermore, the low-side NMOSFET device 16 and the Schottky diode 18 are disposed on the second chip holder 12j. The drain of the low-side NMOSFET device 16 and an N-terminal of the Schottky diode 18 are electrically connected to the second chip holder 12j, and the source 16b of the low-side NMOSFET device 16 is electrically connected to a P-terminal of the Schottky diode 18 and the fourth lead 12d by means of metal wires 22. The gate 16c of the low-side NMOSFET device 16 is electrically connected to the third lead 12c by means of metal wires 22. Accordingly, the first lead 12a and the second lead 12b stand for the drain of the high-side NMOSFET device 14, and the third lead 12c stands for the gate 16c of the low-side NMOSFET device 16. The fourth lead 12d stands for the source 16b of the low-side NMOSFET device 16, and the fifth lead 12e, the sixth lead 12f, and the seventh lead 12g stand for the source 14b of the high-side NMOSFET device 14 and the drain of the low-side NMOSFET device 16. The eighth lead 12h stands for the gate 14c of the high-side NMOSFET device 14.

In the package structure 10 of the conventional Buck converter, the drain of the high-side NMOSFET device 14 and the drain of the low-side NMOSFET device 16 are both at a lower side of the chip. To prevent electrical connection between the drain of the high-side NMOSFET device 14 and the drain of the low-side NMOSFET device 16, the lead frame 12 provides the first chip holder 12i and the second chip holder 12j which are electrically insulated from each other to separately dispose the high-side NMOSFET device 14 and the low-side NMOSFET device 16. Accordingly, a gap that is generally 250 micrometer (µm) is required between the first chip holder 12i and the second chip holder 12j. Furthermore, to prevent the high-side NMOSFET device 14 and the low-side NMOSFET device 16 from being disposed outside the first chip holder 12i and the second chip holder 12j respectively, a width between a side of the high-side NMOSFET device 14 and an edge of the first chip holder 12i and a width between a side of the low-side NMOSFET device 16 and an edge of the second chip holder 12j should be also 250 µm.

Consequently, the gap between the high-side NMOSFET device 14 and the low-side NMOSFET device 16 requires at least 750 µm. With the fixed size of the package structure 10, the dimensions of the high-side NMOSFET device 14 and the low-side NMOSFET device 16 are confined. Therefore, turn-on resistances between the drain and the source 14b of the high-side NMOSFET device 14 and between the drain and the source 16b of the low-side NMOSFET device 16 are increased due to the decrease of device chip, and the power loss during voltage conversion increases correspondingly.

In addition, in the package structure 10 of the conventional Buck converter, in order to electrically connect the source 14b of the high-side NMOSFET device 14 to the drain of the low-side NMOSFET device 16, the source 14b of the high-side NMOSFET device 14 is electrically connected to the seventh lead 12g by means of metal wires 22, and the seventh lead 12g is connected to the second chip holder 12j. Therefore, the resistance between the source 14b of the high-side NMOSFET device 14 and the drain of the low-side NMOSFET device 16 is restricted by the transmission path and the resistance may further cause the power loss during voltage conversion.

Accordingly, to decrease the power loss due to the package structure of the conventional Buck converter is really the subject to be improved in this field.

SUMMARY OF THE INVENTION

It is therefore one of the objectives of the present invention to provide a semiconductor device integrated with a converter and a package structure thereof to decrease the power loss due to the package structure of the converter.

According to an embodiment of the present invention, the present invention provides a semiconductor device integrated with a converter. The semiconductor device includes a semiconductor substrate, at least a high-side transistor device, a high-side drain metal layer, a high-side gate metal layer, a common metal layer, at least a low-side transistor device, a low-side source metal layer, a low-side gate metal layer and a first interlayer dielectric layer. The semiconductor substrate has a first conductive type, and has a high-side transistor device region and a low-side transistor device region. The high-side transistor device is disposed in the high-side transistor device region and the high-side transistor device includes a doped high-side base region, a light-doped drain region, a doped drain region, a doped high-side source region, and a high-side gate conductive layer. The doped high-side base region has a second conductive type and is disposed within the semiconductor substrate of the high-side transistor device region. The light-doped drain region has the first conductive type and is disposed within the doped high-side base region. The doped drain region has the first conductive type and is disposed within the light-doped drain region. The doped high-side source region has the first conductive type and is disposed in the doped high-side base region at a side of the light-doped drain region. The high-side gate conductive layer is disposed on the doped high-side base region between the light-doped drain region and the doped high-side source region. The high-side drain metal layer is electrically connected to the doped drain region and disposed on the semiconductor substrate of the high-side transistor device region. The high-side gate metal layer is electrically connected to the high-side gate conductive layer and disposed on the semiconductor substrate of the high-side transistor device region. The common metal layer is electrically connected to the doped high-side source region and the semiconductor substrate, and the common metal layer is disposed on the lower surface of the semiconductor substrate. The low-side transistor device is disposed in the low-side transistor device region, and the low-side transistor device includes a gate, a source, and a drain. The semiconductor substrate serves as the drain of the low-side transistor device. The low-side source metal layer is disposed on the semiconductor substrate of the low-side transistor device region and is electrically connected to the source of the low-side transistor device. And the low-side gate metal layer is disposed on the semiconductor substrate of the low-side transistor device region and is electrically connected to the gate of the low-side transistor device. The first interlayer dielectric layer is disposed between the semiconductor substrate and the high-side drain metal layer and between the semiconductor substrate and the low-side source metal layer.

According to an embodiment of the present invention, the present invention provides a package structure of the semiconductor device integrated with a converter. The package structure of the semiconductor device includes a lead frame, a semiconductor device and a package. The lead frame includes a chip holder, a first lead, a second lead, a third lead, a fourth lead, a fifth lead, a sixth lead, a seventh lead and an eighth lead. The chip holder includes a first side and a second side disposed oppositely to the first side. The first lead, the second lead, the third lead, and the fourth lead are disposed at the first side of the chip holder, and the third lead and the fourth lead are electrically connected to the chip holder. The fifth lead, the sixth lead, the seventh lead and the eighth lead are disposed at the second side of the chip holder, the fifth lead and the sixth lead are electrically connected with each other, and the seventh lead and the eighth lead are electrically connected with each other. The semiconductor device is disposed on the chip holder, and the semiconductor device includes a semiconductor substrate, at least a high-side transistor device, a high-side drain metal layer, a high-side gate metal layer, a common metal layer, at least a low-side transistor device, a low-side source metal layer, a low-side gate metal layer and a first interlayer dielectric layer. The semiconductor substrate has a first conductive type, and the semiconductor substrate has a high-side transistor device region and a low-side transistor device region. The high-side transistor device is disposed in the high-side transistor device region, and the high-side transistor device includes a doped high-side base region, a light-doped drain region, a doped drain region, a doped high-side source region, and a high-side gate conductive layer. The doped high-side base region has a second conductive type and is disposed within the semiconductor substrate of the high-side transistor device region. The light-doped drain region has the first conductive type and is disposed within the doped high-side base region. The doped drain region has the first conductive type and is disposed within the light-doped drain region. The doped high-side source region has the first conductive type and is disposed in the doped high-side base region at a side of the light-doped drain region. The high-side gate conductive layer is disposed on the doped high-side base region between the light-doped drain region and the doped high-side source region. The high-side drain metal layer is electrically connected to the doped drain region and disposed on the semiconductor substrate of the high-side transistor device region. The high-side gate metal layer is electrically connected to the high-side gate conductive layer and disposed on the semiconductor substrate of the high-side transistor device region. The common metal layer is electrically connected to the doped high-side source region and the semiconductor substrate and the common metal layer is disposed on the lower surface of the semiconductor substrate. The low-side transistor device is disposed in the low-side transistor device region and the low-side transistor device includes a gate, a source, and a drain. The semiconductor substrate serves as the drain of the low-side transistor device. The low-side source metal layer is disposed on the semiconductor substrate of the low-side transistor device region and is electrically connected to the source of the low-side transistor device. And the low-side gate metal layer is disposed on the semiconductor substrate of the low-side transistor device region and is electrically connected to the gate of the low-side transistor device. The first interlayer dielectric layer is disposed between the semiconductor substrate and the high-side drain metal layer and between the semiconductor substrate and the low-side source metal layer. And the package encapsulates the semiconductor device and a portion of the lead frame.

In conclusion, the semiconductor device of the present invention includes the high-side transistor device and the low-side transistor device on the same semiconductor substrate, so that only a chip holder is required to dispose the semiconductor device in the package structure, and the area of the semiconductor substrate or the sizes of the high-side transistor device and the low-side transistor device in the semiconductor device disposed on the chip holder can be increased to reduce the turn-on resistance between the drain and the source of the high-side transistor device and the turn-on resistance between the drain and the source of the low-side transistor device. Thus, the power loss during power supply conversion can be reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
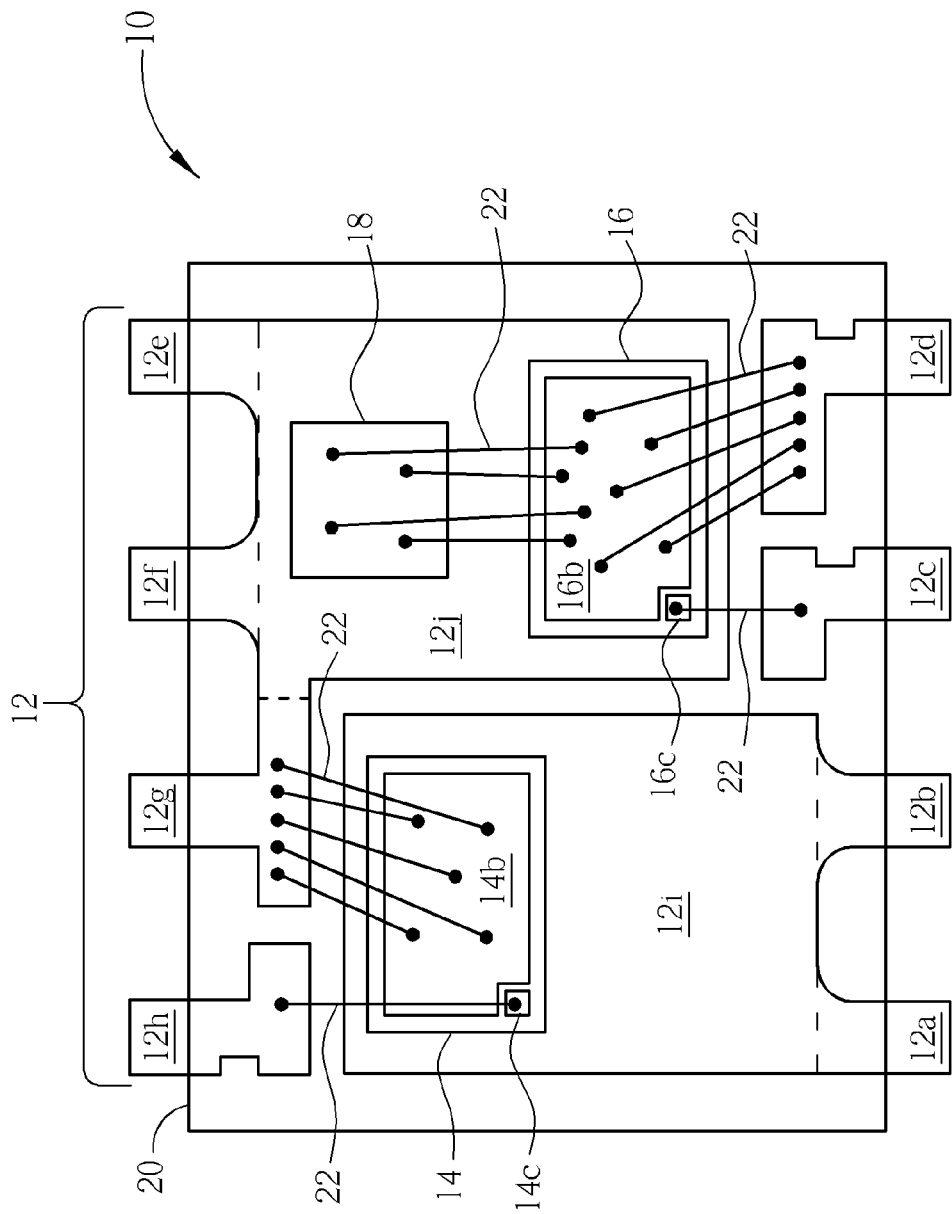
FIG. 1 illustrates a schematic diagram of a package structure of a conventional Buck converter.
Figure 2:
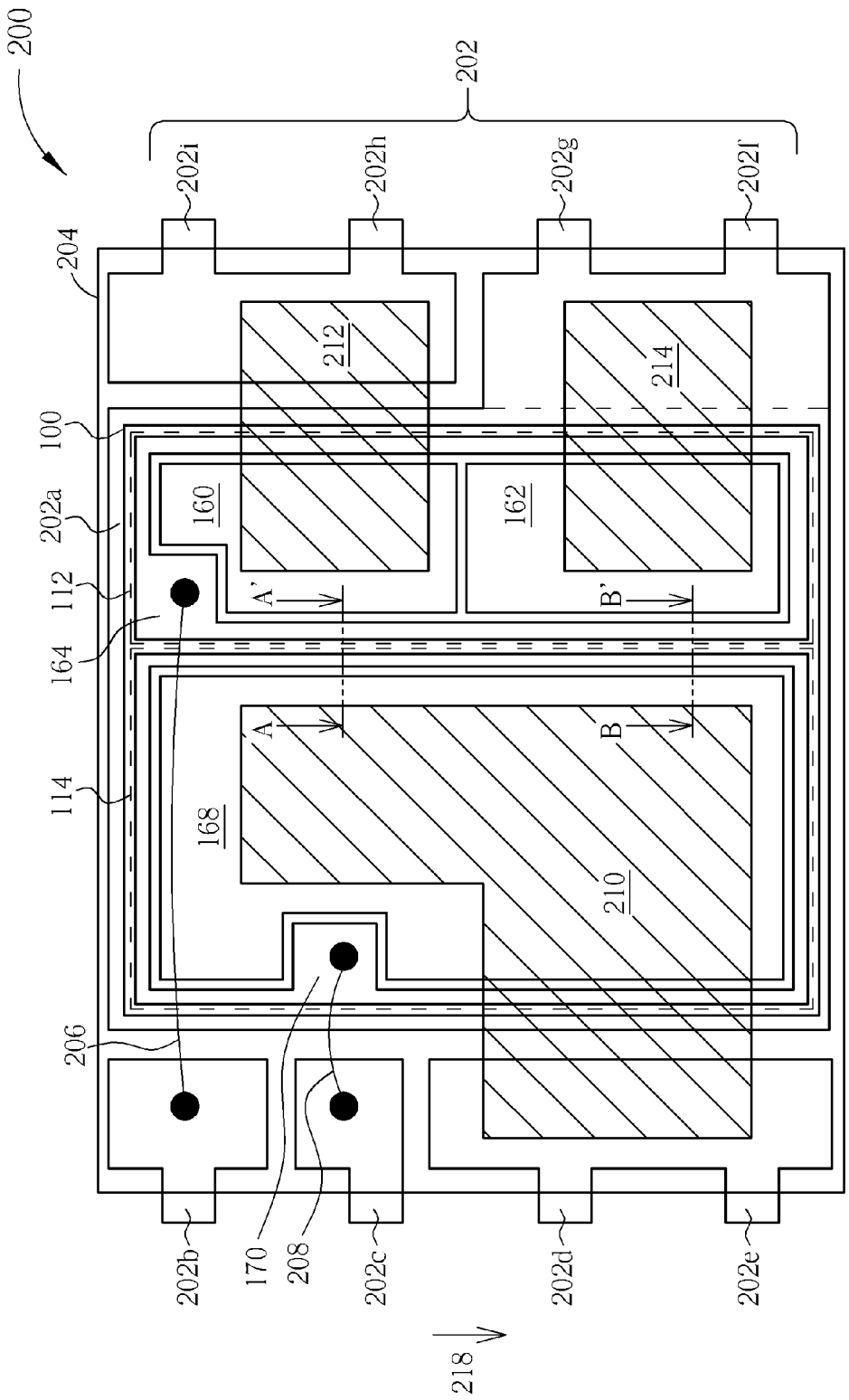
FIG. 2 is a top-view illustrating a package structure of a semiconductor device integrated with a converter according to a first exemplary embodiment of the present invention.
Figure 3:
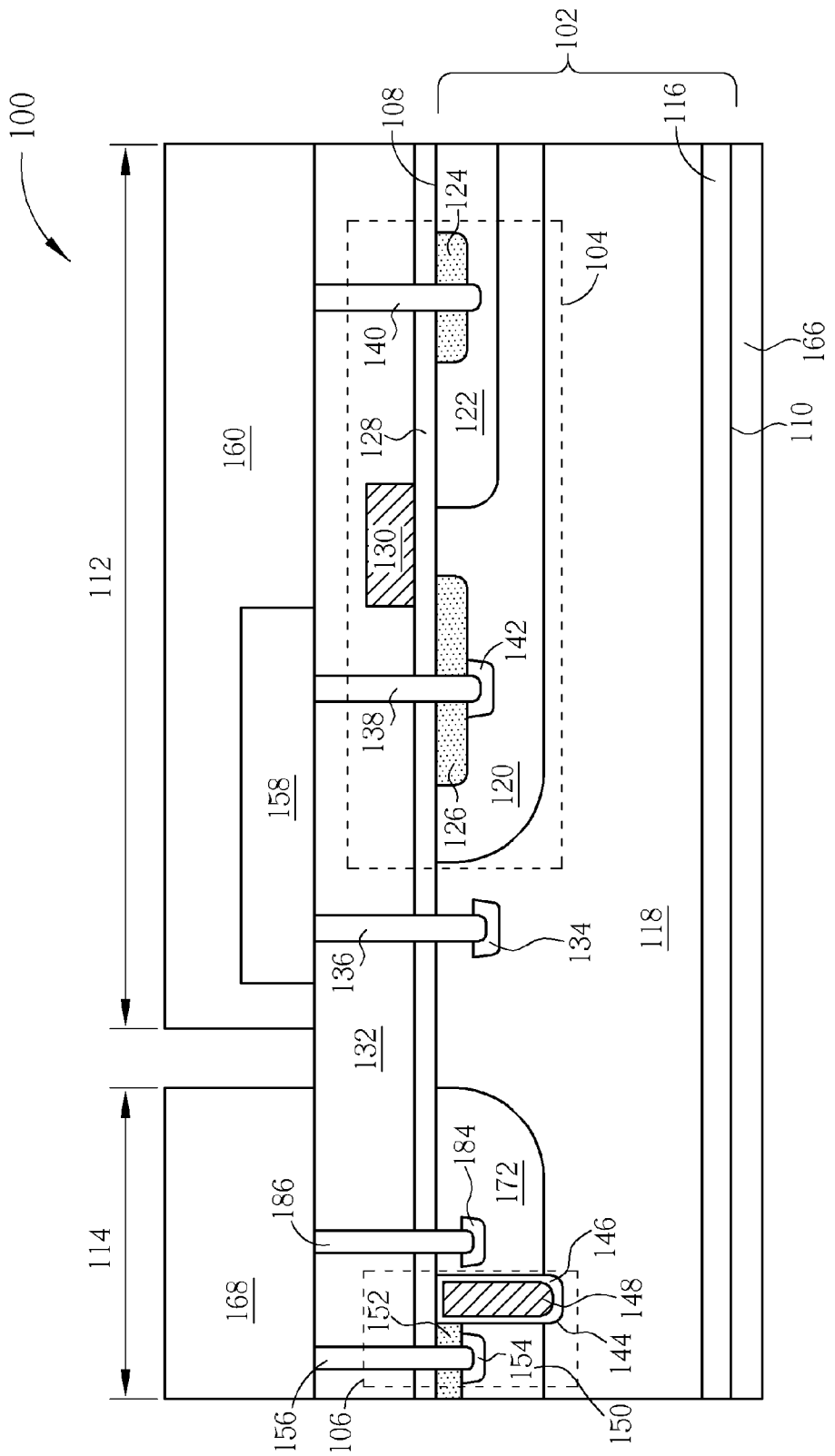
FIG. 3-FIG. 7 are schematic diagrams illustrating a manufacturing method of a semiconductor device integrated with a converter according to a first exemplary embodiment of the present invention.
Figure 4:
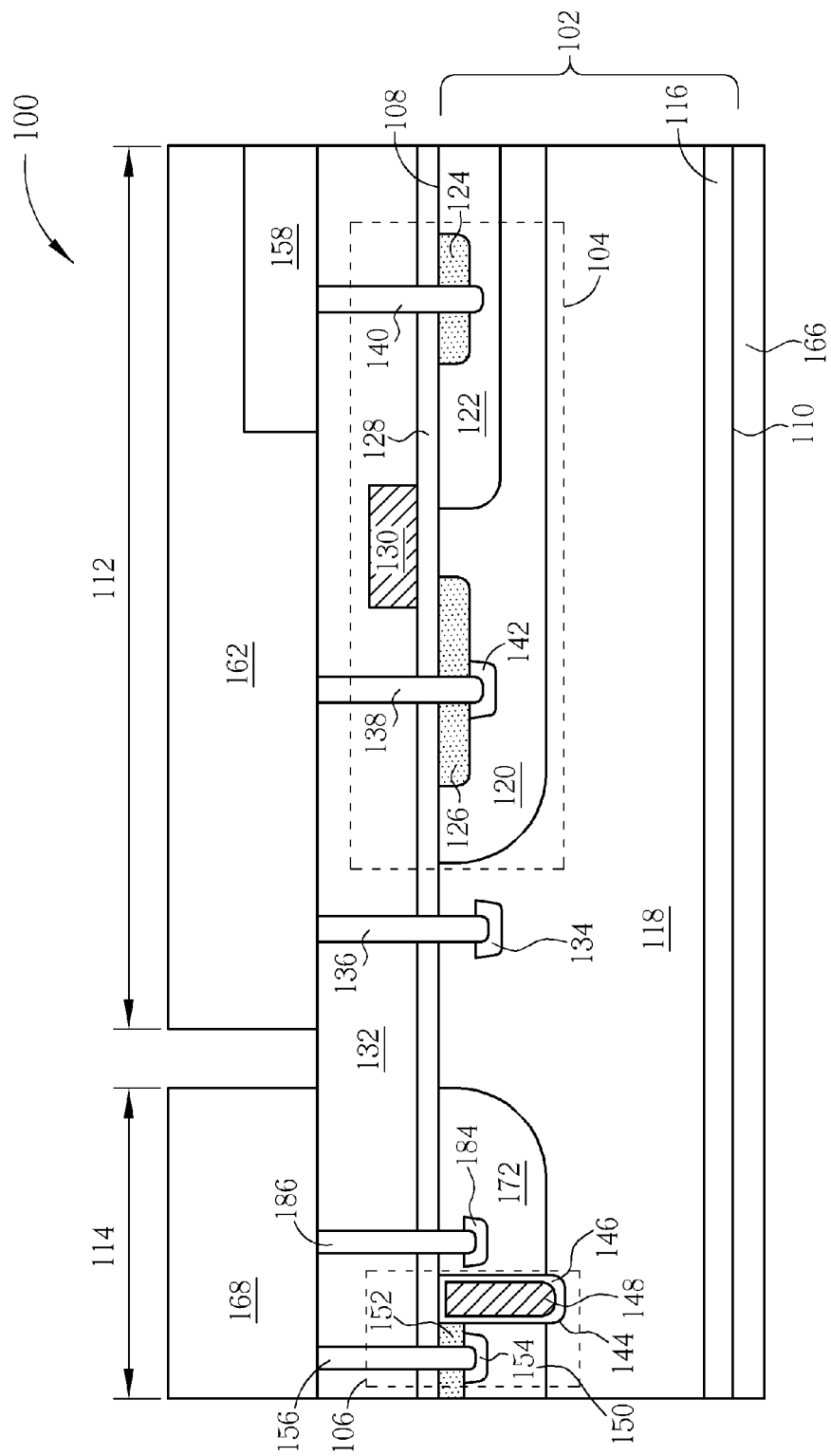

Please refer to FIG. 2 through FIG. 4. FIG. 2 is a top-view illustrating a package structure of a semiconductor device integrated with a converter according to a first exemplary embodiment of the present invention. FIG. 3 is a cross-sectional view of FIG. 2 along a line AA'. FIG. 4 is a cross-sectional view of FIG. 2 along a line BB'. As shown in FIG. 2 through FIG. 4, a semiconductor device 100 according to this exemplary embodiment includes a semiconductor substrate 102, at least a high-side transistor device 104, and at least a low-side transistor device 106. The semiconductor substrate 102 includes an upper surface 108 and a lower surface 110, the upper surface 108 of the semiconductor substrate 102 has a high-side transistor device region 112 and a low-side transistor device region 114 defined thereon. The high-side transistor device 104 is disposed in the high-side transistor device region 112, and the low-side transistor device 106 is disposed in the low-side transistor device region 114. Additionally, the semiconductor substrate 102 has a first conductive type, and the first conductive type may be taken as N-type for instance in this exemplary embodiment, but not limited thereto. Furthermore, the semiconductor substrate 102 includes a substrate 116 and an epitaxial layer 118 disposed on the substrate 116. The substrate 116 could be silicon substrate, and a dopant concentration of the substrate 116 is higher than a dopant concentration of the epitaxial layer 118. The voltage endurance of the semiconductor device 100 could be increased with the increase of the thickness and the decrease of the dopant concentration of the epitaxial layer 118, so the thickness of the epitaxial layer 118 can be adjusted according to the requirement of voltage endurance.

In this exemplary embodiment, the high-side transistor device 104 includes a doped high-side base region 120, a light-doped drain region 122, a doped drain region 124, at least a doped high-side source region 126, a first insulating layer 128, and at least a high-side gate conductive layer 130. The doped high-side base region 120 is disposed within the semiconductor substrate 102 in the high-side transistor device region 112, and the doped high-side base region 120 has the second conductive type. The second conductive type may be taken as P-type for instance in this exemplary embodiment, but not limited thereto. The first conductive type and the second conductive type are not limited to be N-type and P-type respectively, and can be interchanged. The light-doped drain region 122 is disposed within the doped high-side base region 120, and the light-doped drain region 122 has the first conductive type. The doped drain region 124 is disposed within the light-doped drain region 122, and the doped drain region 124 has the first conductive type. Furthermore, the light-doped drain region 122 and the doped drain region 124 serve as the drain of the high-side transistor device 104. The doped high-side source region 126 is disposed in the doped high-side base region 120 at a side of the light-doped drain region 122, and the doped high-side source region 126 has the first conductive type. Furthermore, the doped high-side source region 126 serves as the source of the high-side transistor device 104, and the doped high-side base region 120 between the light-doped drain region 122 and the doped high-side source region 126 could serve as the channel of the high-side transistor device 104. The dopant concentrations of the doped high-side source region 126 and the doped drain region 124 are substantially higher than the dopant concentration of the light-doped drain region 122, and the light-doped drain region 122 is used to endure the high voltage from the doped drain region 124 to prevent the high-side transistor device 104 from damage by the high voltage. Accordingly, the high-side transistor device 104 may be a laterally diffused metal-oxide-semiconductor (LDMOS). Additionally, the first insulating layer 128 covers the upper surface 108 of the semiconductor substrate 102, and the high-side gate conductive layer 130 is disposed on the doped high-side base region 120 between the light-doped drain region 122 and the doped high-side source region 126 and serves as the gate of the high-side transistor device 104. The high-side transistor device 104 of the present invention is not limited to have only one doped high-side source region 126 and only one high-side gate conductive layer 130, and the numbers of the doped high-side source regions 126 and the high-side gate conductive layers 130 can be adjusted with the number of the required high-side transistor device 104. In other words, the high-side transistor device 104 could include two high-side source regions 126 disposed respectively in the doped high-side base region 120 at two sides of the light-doped drain region 122, but not limited thereto.

The semiconductor device 100 in this exemplary embodiment further includes a first interlayer dielectric layer 132, a first doped contact region 134, a first contact plug 136, at least one second contact plug 138, a third contact plug 140, and the high-side transistor device 104 further includes a second doped contact region 142. The first interlayer dielectric layer 132 covers the first insulating layer 128. The first doped contact region 134 is disposed in the semiconductor substrate 102 at a side of the doped high-side base region 120 of the high-side transistor device 104, and the first doped contact region 134 has the second conductive type. The first contact plug 136 is disposed upon the first doped contact region 134 and penetrates through the first insulating layer 128 and the first interlayer dielectric layer 132. The second doped contact region 142 is disposed within the doped high-side base region 120 at a lower side of the doped high-side source region 126, and the second doped contact region 142 has the second conductive type. The second contact plug 138 is disposed upon the second doped contact region 142 and penetrates through the doped high-side source region 126, the first insulating layer 128 and the first interlayer dielectric layer 132. The third contact plug 140 is disposed upon the light-doped drain region 122 and penetrates through the doped drain region 124, the first insulating layer 128 and the first interlayer dielectric layer 132.

According to this exemplary embodiment, the semiconductor substrate 102 of the low-side transistor device region 114 includes at least one trench 144. The low-side transistor device 106 includes a second insulating layer 146, a low-side gate conductive layer 148, a doped low-side base region 150, a doped low-side source region 152, a third doped contact region 154, and a fourth contact plug 156. The second insulating layer 146 covers the semiconductor substrate 102 in the trench 144, and the first insulating layer 128 and the second insulating layer 146 may be dielectric layers made of BPSG or silicon oxide, but not limited thereto. The low-side gate conductive layer 148 is disposed in the trench 144 and serves as a gate of the low-side transistor device 106. The high-side gate conductive layer 130 and the low-side gate conductive layer 148 may include doped polysilicon, but not limited thereto. The doped low-side base region 150 is disposed within the semiconductor substrate 102 of the low-side transistor device region 114 at a side of the trench 144, and the doped low-side base region 150 has the second conductive type. The doped low-side source region 152 is disposed within the doped low-side base region 150, and the doped low-side source region 152 has the first conductive type and serves as the source of the low-side transistor device 106. The third doped contact region 154 is disposed within the doped low-side base region 150 at a lower side of the doped low-side source region 152 and the third doped contact region 154 has the second conductive type. The fourth contact plug 156 is disposed upon the third doped contact region 154 and penetrates through the doped low-side source region 152, the first insulating layer 128 and the first interlayer dielectric layer 132. Additionally, the semiconductor substrate 102 of the low-side transistor device region 114 serves as a drain of the low-side transistor device 106. The doped low-side base region 150 disposed between the doped low-side source region 152 and the semiconductor substrate 102 and adjacent to the second insulating layer 146 could serve as the channel of the low-side transistor device 106. Accordingly, the low-side transistor device 106 of this exemplary embodiment may be a trench metal-oxide-semiconductor, but not limited thereto. And the number of the trench 144 of the present invention is not limited to be only one, and can be a plurality. Furthermore, the number of the trench 144 can be adjusted according to the number of the required low-side transistor device 106.

In addition, the semiconductor device 100 according to this exemplary embodiment further includes a second interlayer dielectric layer 158, a high-side drain metal layer 160, a high-side source metal layer 162, a high-side gate metal layer 164, a common metal layer 166, a low-side source metal layer 168 and a low-side gate metal layer 170. The second interlayer dielectric layer 158 is disposed on the first interlayer dielectric layer 132 and exposes a portion of the first contact plugs 136, a portion of the second contact plugs 138 and a portion of the third contact plugs 140. The high-side drain metal layer 160 is disposed on the first interlayer dielectric layer 132, the second interlayer dielectric layer 158 and the third contact plug 140 in the high-side transistor device region 112. Furthermore, the high-side drain metal layer 160 is electrically connected to the doped drain region 124 and the light-doped drain region 122 by means of the third contact plug 140. The high-side source metal layer 162 is disposed on the first interlayer dielectric layer 132, the second interlayer dielectric layer 158, the first contact plug 136 and the second contact plug 138 in the high-side transistor device region 112 and at a side of the high-side drain metal layer 160. Furthermore, the high-side source metal layer 162 is electrically connected to the first doped contact region 134 and the epitaxial layer 118 by means of the first contact plug 136, and electrically connected to the doped high-side source region 126 and the second doped contact region 142 by means of the second contact plug 138. It is appreciated that, in this exemplary embodiment, the high-side drain metal layer 160 and the high-side source metal layer 162 partially overlap the first contact plug 136, the second contact plug 138 and the third contact plugs 140 respectively. And the second interlayer dielectric layer 158 is not only disposed between the high-side drain metal layer 160 and the first contact plug 136 and between the high-side drain metal layer 160 and the second contact plug 138 so as to electrically insulate the high-side drain metal layer 160 from the first contact plug 136 and the second contact plug 138, but also is disposed between the high-side source metal layer 162 and the third contact plugs 140 so as to electrically insulate the high-side source metal layer 162 from the third contact plugs 140. Therefore, the high-side drain metal layer 160 could be insulated from the source of the high-side transistor device 104, and the high-side source metal layer 162 could be insulated from the drain of the high-side transistor device 104. The first interlayer dielectric layer 132 and the second interlayer dielectric layer 158 in this exemplary embodiment could be dielectric layers made of BPSG or silicon oxide, but not limited thereto.

Furthermore, the high-side gate metal layer 164 is disposed on the semiconductor substrate 102 of the high-side transistor device region 112 and surrounds the high-side drain metal layer 160 and the high-side source metal layer 162, and the high-side gate metal layer 164 is electrically connected to the high-side gate conductive layer 130. The common metal layer 166 is disposed on the lower surface 110 of the semiconductor substrate 102 to electrically connect the doped high-side source region 126 and the semiconductor substrate 102. The low-side source metal layer 168 is disposed on the semiconductor substrate 102 of the low-side transistor device region 114 and electrically connected to the doped low-side source region 152 by means of the fourth contact plug 156. The low-side gate metal layer 170 is disposed on the semiconductor substrate 102 of the low-side transistor device 106 and electrically connected to the low-side gate conductive layer 148. It is appreciated that, the semiconductor device 100 according to this exemplary embodiment utilizes the first contact plug 136 to electrically connect the high-side source metal layer 162 to the semiconductor substrate 120 which serves as the drain of the low-side transistor device 106, and therefore, the source of the high-side transistor device 104 could be electrically connected to the drain of the low-side transistor device 106 and the common metal layer 166.

Accordingly, the semiconductor device 100 according to this exemplary embodiment has the high-side transistor device 104 and the low-side transistor device 106 disposed on the same semiconductor substrate 102, and the source of the high-side transistor device 104 and the drain of the low-side transistor device 106 are electrically connected by means of the first contact plug 136, so that the high-side transistor device 104 and the low-side transistor device 106 can be integrated into one converter.

Figure 5:
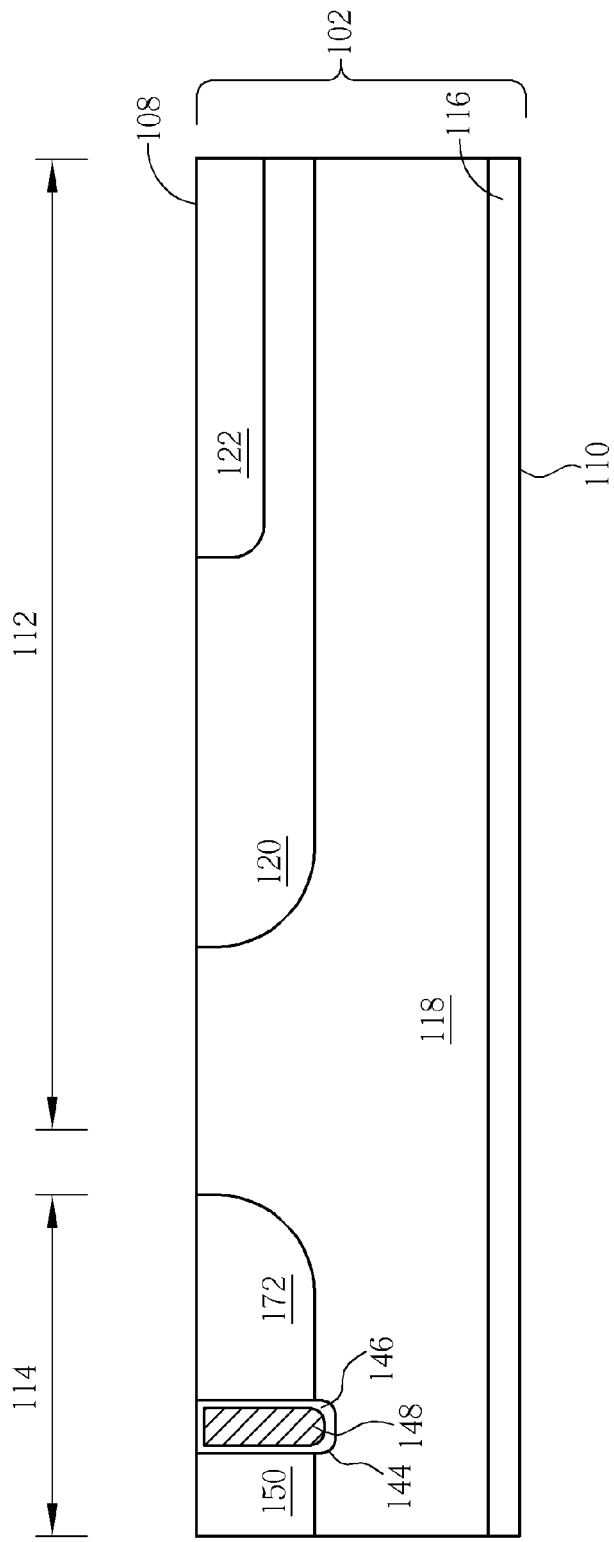

The manufacturing method of the semiconductor device according to this exemplary embodiment of the present invention is illustrated as below, the first conductive type and the second conductive type may respectively be taken as N-type and P-type for example, but not limited thereto. Please refer to FIG. 5 through FIG. 7, and refer to FIG. 3 and FIG. 4 together. FIG. 3 through FIG. 7 are schematic diagrams illustrating a manufacturing method of a semiconductor device integrated with a converter according to the first exemplary embodiment of the present invention. As shown in FIG. 5, first, the N-type semiconductor substrate 102 is provided. Then, a photolithography and etching process is performed with a first photomask to form the trench 144 on the upper surface 108 of the semiconductor substrate 102 in the low-side transistor device region 114. After, the second insulating layer 146 is formed to cover the N-type semiconductor substrate 102 in the trench 144, and the trench 144 is filled with the low-side gate conductive layer 148. Next, a photolithography and etching process is performed with a second photomask, and then a P-type ion implantation process and a drive-in process is performed to form the P-type doped high-side base region 120 in the N-type semiconductor substrate 102 in the high-side transistor device 112, the P-type doped low-side base region 150 in the N-type semiconductor substrate 102 at a side of the trench 144 and a P-type doped base region 172 in the N-type semiconductor substrate 102 at an edge of the low-side transistor device 114. The P-type doped high-side base region 120 and the P-type doped low-side base region 150 are formed simultaneously so as to have the same depth. The implanted ions used in the P-type ion implantation process for forming the P-type doped region include dopant ion, such as boron ion or boron fluoride ion, but not limited thereto. Subsequently, a photolithography and etching process is performed with a third photomask, and then an N-type ion implantation process and a drive-in process are performed to form the N-type light-doped drain region 122 within the P-type doped high-side base region 120.

Figure 6:
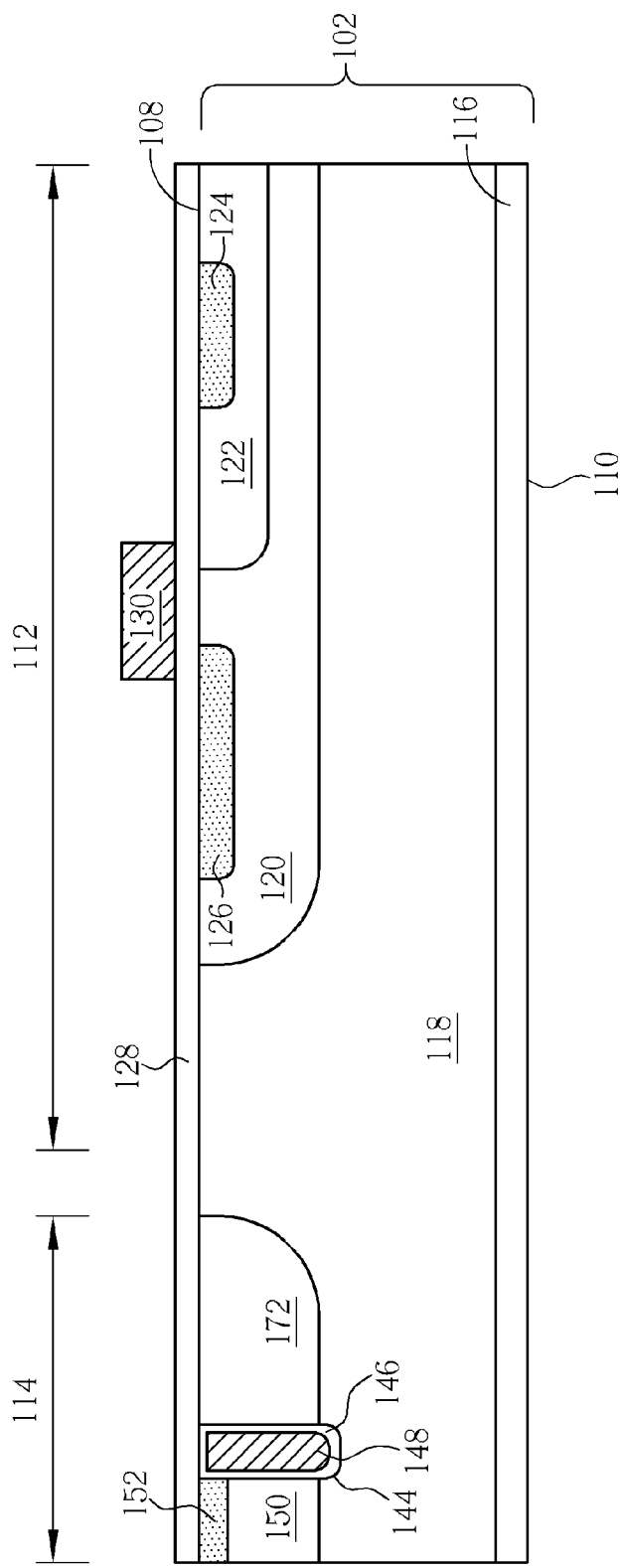

As shown in FIG. 6, a photolithography and etching process is performed with a fourth photomask to form the N-type doped high-side source region 126 in the P-type doped high-side base region 120 at a side of the N-type light-doped drain region 122, the N-type doped drain region 124 in the N-type light-doped drain region 122 in the high-side transistor device region 112 and the N-type doped low-side source region 152 in the P-type doped low-side base region 150. Then, the first insulating layer 128 is formed on the upper surface 108 of the N-type semiconductor substrate 102. Furthermore, a photolithography and etching process is performed with a fifth photomask to form the high-side gate conductive layer 130 on the first insulating layer 128 between the N-type light-doped drain region 122 and the N-type doped high-side source region 126.

Figure 7:
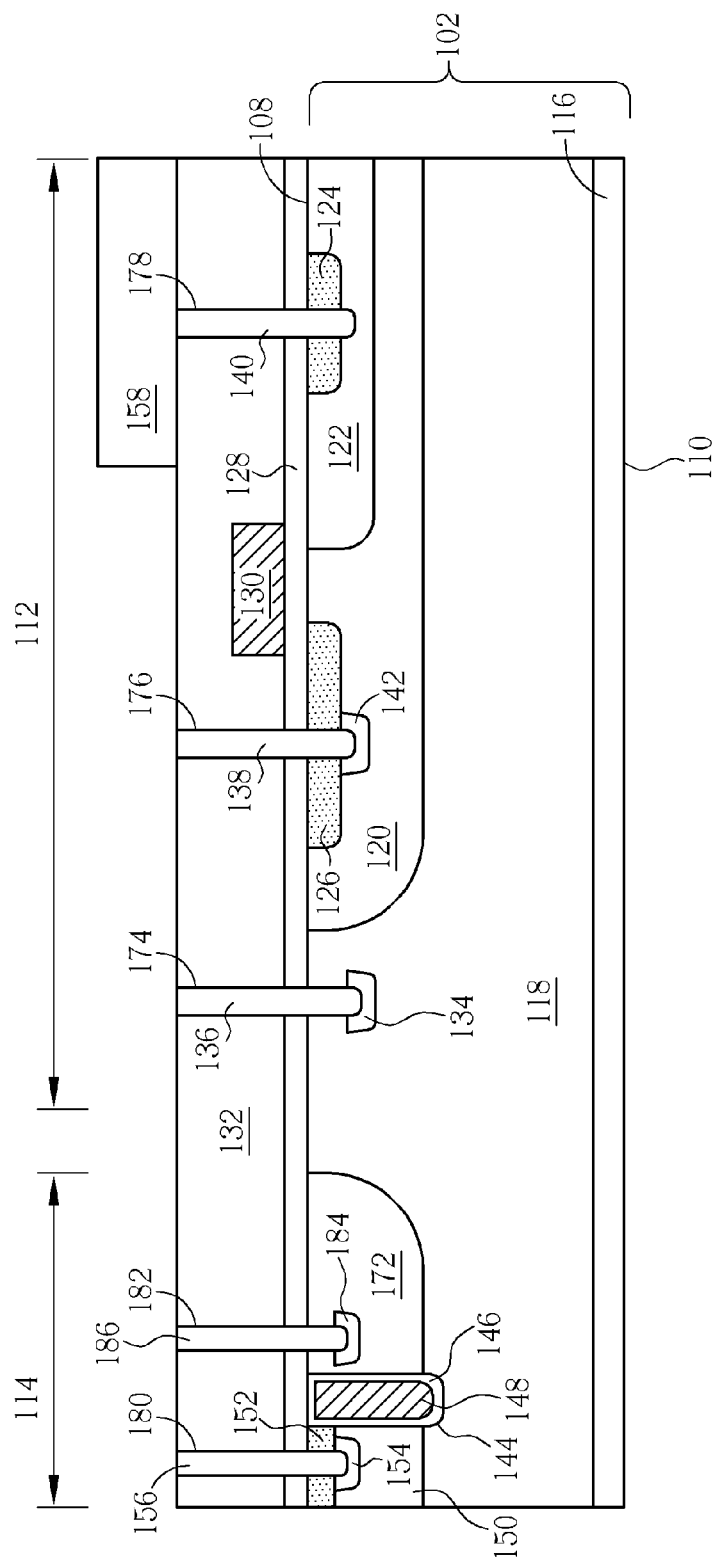

As shown in FIG. 7, the first interlayer dielectric layer 132 is formed to cover the first insulating layer 128 and the high-side gate conductive layer 130, and a photolithography and etching process is performed with a sixth photomask to form a first contact hole 174, at least one second contact hole 176, a third contact hole 178, a fourth contact hole 180 and a fifth contact hole 182 within the first interlayer dielectric layer 132. The first contact hole 174 penetrates through the first interlayer dielectric layer 132 and the first insulating layer 128 in the high-side transistor device region 112, so that the first contact hole 174 exposes a part of the N-type semiconductor substrate 102 between the high-side transistor device region 112 and the low-side transistor device region 114. The second contact hole 176 penetrates through the first interlayer dielectric layer 132, the first insulating layer 128 and the N-type doped high-side source region 126, so that the second contact hole 176 exposes the P-type doped high-side base region 120. The third contact hole 178 penetrates through the first interlayer dielectric layer 132, the first insulating layer 128 and the N-type doped drain region 124, so that the third contact hole 178 exposes the N-type light-doped drain region 122. The fourth contact hole 180 penetrates through the first interlayer dielectric layer 132, the first insulating layer 128 and the N-type doped low-side source region 152, so that the fourth contact hole 180 exposes the P-type doped low-side base region 150. The fifth contact hole 182 penetrates through the first interlayer dielectric layer 132 and the first insulating layer 128, so that the fifth contact hole 182 exposes the P-type doped base region 172. Furthermore, a photolithography and etching process is performed with a seventh photomask, and then a P-type ion implantation process and a drive-in process are performed to form the first P-type doped contact region 134 within the N-type semiconductor substrate 102 exposed by the first contact hole 174, the second P-type doped contact region 142 within the P-type doped high-side base region 120 exposed by the second contact hole 176, the third P-type doped contact region 154 within the P-type doped low-side base region 150 exposed by the fourth contact hole 180, and a fourth P-type doped contact region 184 within the P-type doped base region 172 exposed by the fifth contact hole 182. Then, the first contact plug 136 is formed to fill the first contact hole 174. The second contact plug 138 is formed to fill the second contact hole 176. The third contact plug 140 is formed to fill the third contact hole 178. The fourth contact plug 156 is formed to fill the fourth contact hole 180, and a fifth contact plug 186 is formed to fill the fifth contact hole 182.

Subsequently, as shown in FIG. 3 and FIG. 4, a photolithography and etching process is performed with an eighth photomask to form a second interlayer dielectric layer 158 on the first interlayer dielectric layer 132 in the high-side transistor device region 112, and the second interlayer dielectric layer 158 exposes the first contact plug 136, a portion of the second contact plug 138 and a portion of the third contact plug 140. Next, a photolithography and etching process is performed with a ninth photomask to form the high-side drain metal layer 160, the high-side source metal layer 162 and the high-side gate metal layer (not shown in FIG. 3 and FIG. 4) on the second interlayer dielectric layer 158 in the high-side transistor device region 112 and form the low-side source metal layer 168 and the low-side gate metal layer (not shown in FIG. 3 and FIG. 4) on the first interlayer dielectric layer 132 in the low-side transistor device region 114. Finally, the common metal layer 166 is formed on the lower surface 110 of the semiconductor substrate 102, and the semiconductor device 100 according to this exemplary embodiment is completed. The materials of the common metal layer 166, the low-side source metal layer 168, the high-side source metal layer 162 and the high-side drain metal layer 160 could include metals such as AlCu, AlSiCu, TiW, TiN and tungsten, but not limited thereto.

The present invention further provides a package structure of the semiconductor device integrated with the converter. Please keep referring to FIG. 2. The package structure 200 of the semiconductor device according to this exemplary embodiment includes a lead frame 202, the semiconductor device 100 integrated with the converter, and a package 204. The lead frame 202 includes a chip holder 202a, a first lead 202b, a second lead 202c, a third lead 202d, a fourth lead 202e, a fifth lead 202f, a sixth lead 202g, a seventh lead 202h, an eighth lead 202i. The chip holder 202a has a first side and a second side disposed oppositely to the first side. The first lead 202b, the second lead 202c, the third lead 202d, and the fourth lead 202e are disposed at the first side of the chip holder 202a and arranged sequentially along a first direction 218. And the fifth lead 202f, the sixth lead 202g, the seventh lead 202h, the eighth lead 202i are disposed at the second side of the chip holder 202a, and the eighth lead 202i, the seventh lead 202h, the sixth lead 202g and the fifth lead 202f are arranged sequentially along the first direction 218. The third lead 202d and the fourth lead 202e are connected to each other, and the seventh lead 202h and the eighth lead 202i are connected to each other. The fifth lead 202f and the sixth lead 202g are connected to each other and further connected to the chip holder 202a. Besides, the semiconductor device 100 may adhere to the chip holder 202a through a conductive adhesive, so that the common metal layer 166 of the semiconductor device 100 is electrically connected to the chip holder 202a and further electrically connected to the fifth lead 202f and the sixth lead 202g.

In this exemplary embodiment, the package structure 200 of the semiconductor device further includes a first conductive component 206, a second conductive component 208, a third conductive component 210, a fourth conductive component 212, and a fifth conductive component 214. The first conductive component 206 electrically connects the high-side gate metal layer 164 to the first lead 202b, and the second conductive component 208 electrically connects the low-side gate metal layer 170 to the second lead 202c. The third conductive component 210 electrically connects the low-side source metal layer 168 to the third lead 202d and the fourth lead 202e, and the fourth conductive component 212 electrically connects the high-side drain metal layer 160 to the seventh lead 202h and the eighth lead 202i. And the fifth conductive component 214 electrically connects the high-side source metal layer 162 to the fifth lead 202f and the sixth lead 202g. Accordingly, the first lead 202b stands for a gate lead of the high-side transistor device 104. The second lead 202c stands for a gate lead of the low-side transistor device 106. The third lead 202d and the fourth lead 202e stand for a source lead of the low-side transistor device 106. The fifth lead 202f and the sixth lead 202g stand for a source lead of the high-side transistor device 104 and a drain lead of the low-side transistor device 106, and the seventh lead 202h and the eighth lead 202i stand for a drain lead of the high-side transistor device 104. In this exemplary embodiment, the first conductive component 206 and the second conductive component 208 may be metal wires that include gold or copper, but not limited there to. And the third conductive component 210, the fourth conductive component 212, and the fifth conductive component 214 may be metal plates that include copper, but not limited thereto. Additionally, the package 204 encapsulates the semiconductor device 100, the first conductive component 206, the second conductive component 208, the third conductive component 210, the fourth conductive component 212, the fifth conductive component 214 and a portion of the lead frame 202 for protecting the semiconductor device 100 and preventing the conductive components electrically connected to the lead frame 202 in the semiconductor device 100 from damage. The material of the package 204 in this exemplary embodiment can include packaging material, such as epoxy resin, but is not limited herein.

It is appreciated that, only one semiconductor device 100 in this exemplary embodiment is required to be disposed in the package structure 200, so that the chip holder 202a does not require to be divided into two parts. When the size of the package structure is fixed, the area of the chip holder 202a in this embodiment could be larger than the total area of the first chip holder and the second chip holder in the conventional package structure, so that the area of the semiconductor substrate 102 or the sizes of the high-side transistor device 104 and the low-side transistor device 106 could be increased in the semiconductor device 100 disposed on the chip holder 202a. Accordingly, the turn-on resistance between the drain and the source of the high-side transistor device 104 and the turn-on resistance between the drain and the source of the low-side transistor device 106 can be decreased, and the power loss during power supply conversion can be reduced. Additionally, the second lead 202c standing for the gate lead of the low-side transistor device 106 is adjacent to the third lead 202d and the fourth lead 202e standing for the source lead of the low-side transistor device 106, so that the distance between the gate and the source of the low-side transistor device 106 is decreased, and the resistance and the inductance electrically connected between the gate and the source of the low-side transistor device 106 may be lowered to prevent response delay when the gate of the low-side transistor device 106 receives signals.

Figure 8:
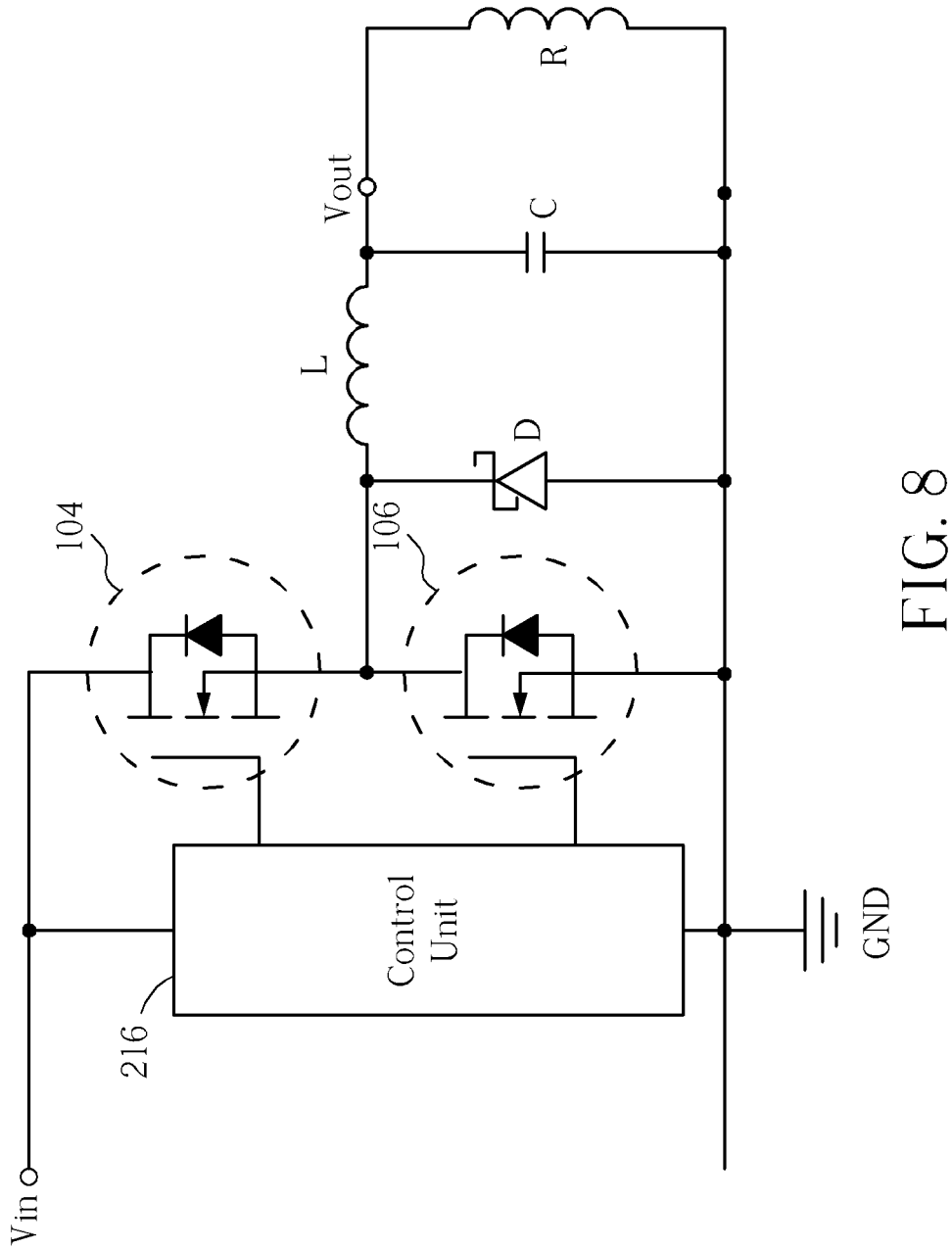
FIG. 8 is a circuit schematic diagram of a semiconductor device integrated with a converter according to the present invention.

Please refer to FIG. 8, and refer to FIG. 2 together. FIG. 8 is a circuit schematic diagram of a converter integrated with the semiconductor device according to the present invention. As shown in FIG. 2 and FIG. 8, the gate of the high-side transistor device 104 is electrically connected to a control unit 216, and the gate of the low-side transistor device 106 is also electrically connected to the control unit 216, so that the first lead 202b standing for the gate lead of the high-side transistor device 104 and the second lead 202c standing for the gate lead of the low-side transistor device 106 are electrically connected to the control unit 216 respectively. The source of the low-side transistor device 106 is electrically connected to a ground terminal GND, and the third lead 202d and the fourth lead 202e standing for the source lead of the low-side transistor device 106 are electrically connected to the ground terminal GND. The drain of the high-side transistor device 104 is electrically connected to an input terminal Vin, and the seventh lead 202h and the eighth lead 202i standing for the drain lead of the high-side transistor device 104 are electrically connected to the input terminal Vin. Furthermore, the common connecting node of the source of the high-side transistor device 104 and the drain of the low-side transistor device 106 is electrically connected to a terminal of an inductor L and a terminal of a Schottky diode D, and the fifth lead 202f and the sixth lead 202g standing for the source lead of the high-side transistor device 104 and the drain lead of the low-side transistor device 106 are electrically connected to a terminal of the inductor L and a terminal of the Schottky diode D. The other terminal of the inductor L is electrically connected to an output terminal Vout and a terminal of a capacitor C, and the other terminal of the Schottky diode D and the other terminal of the capacitor C are electrically connected to the ground terminal GND. Furthermore, a load resistor R is electrically connected to the input terminal Vin and the ground terminal GND. It is appreciated that the seventh lead 202h and the eighth lead 202i electrically connected to the input terminal Vin, and the fifth lead 202f and the sixth lead 202g electrically connected to the output terminal Vout by means of the inductor L are disposed at the same side of the chip holder 202a, so that the resistance, the inductance and the capacitance electrically connected in series are reduced, and raising the voltage conversion efficiency of the package structure 200 of the semiconductor device 100 according to this exemplary embodiment.

Figure 9:
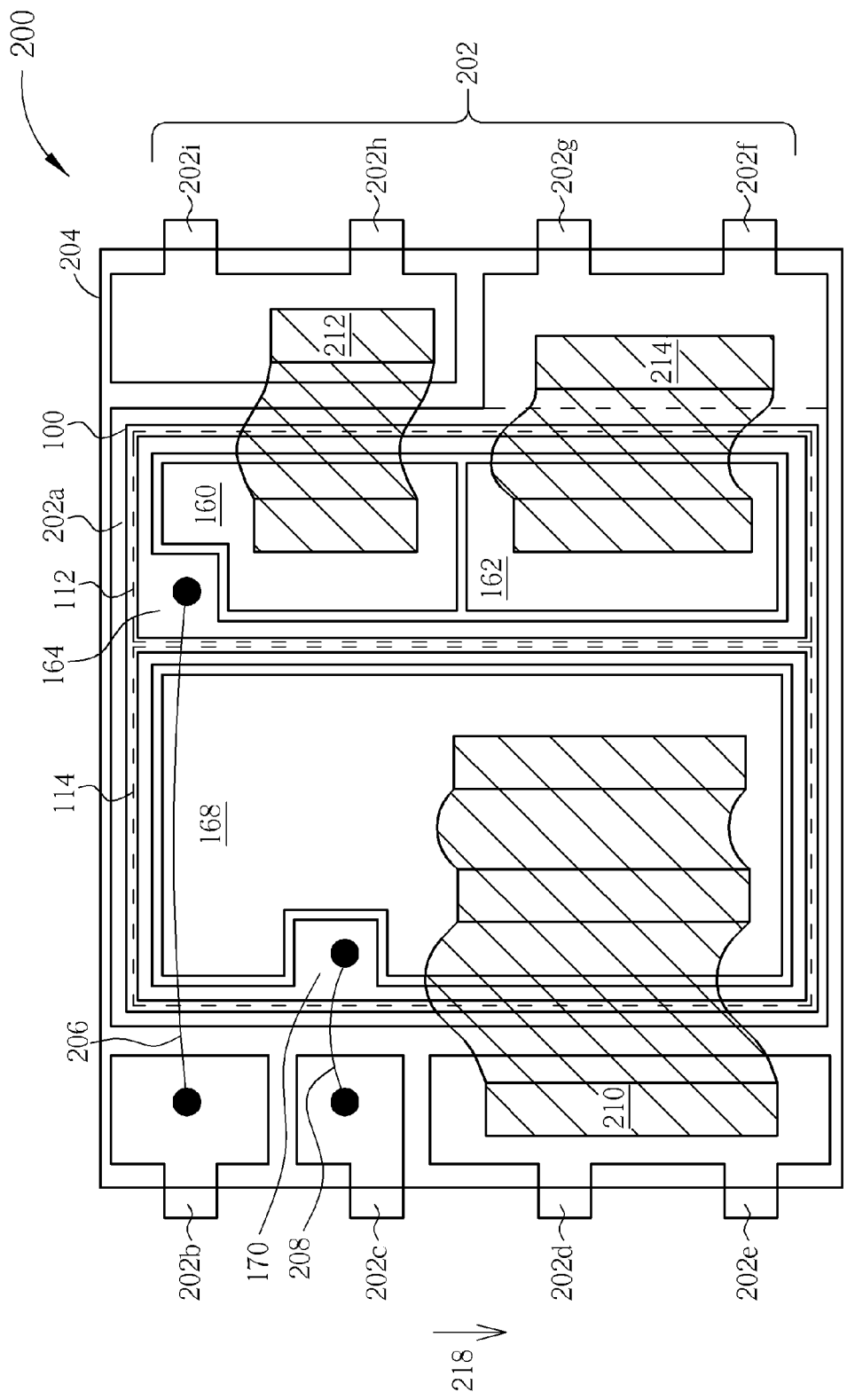
FIG. 9 illustrates a variant of a package structure according to a first exemplary embodiment of the present invention.
Figure 10:
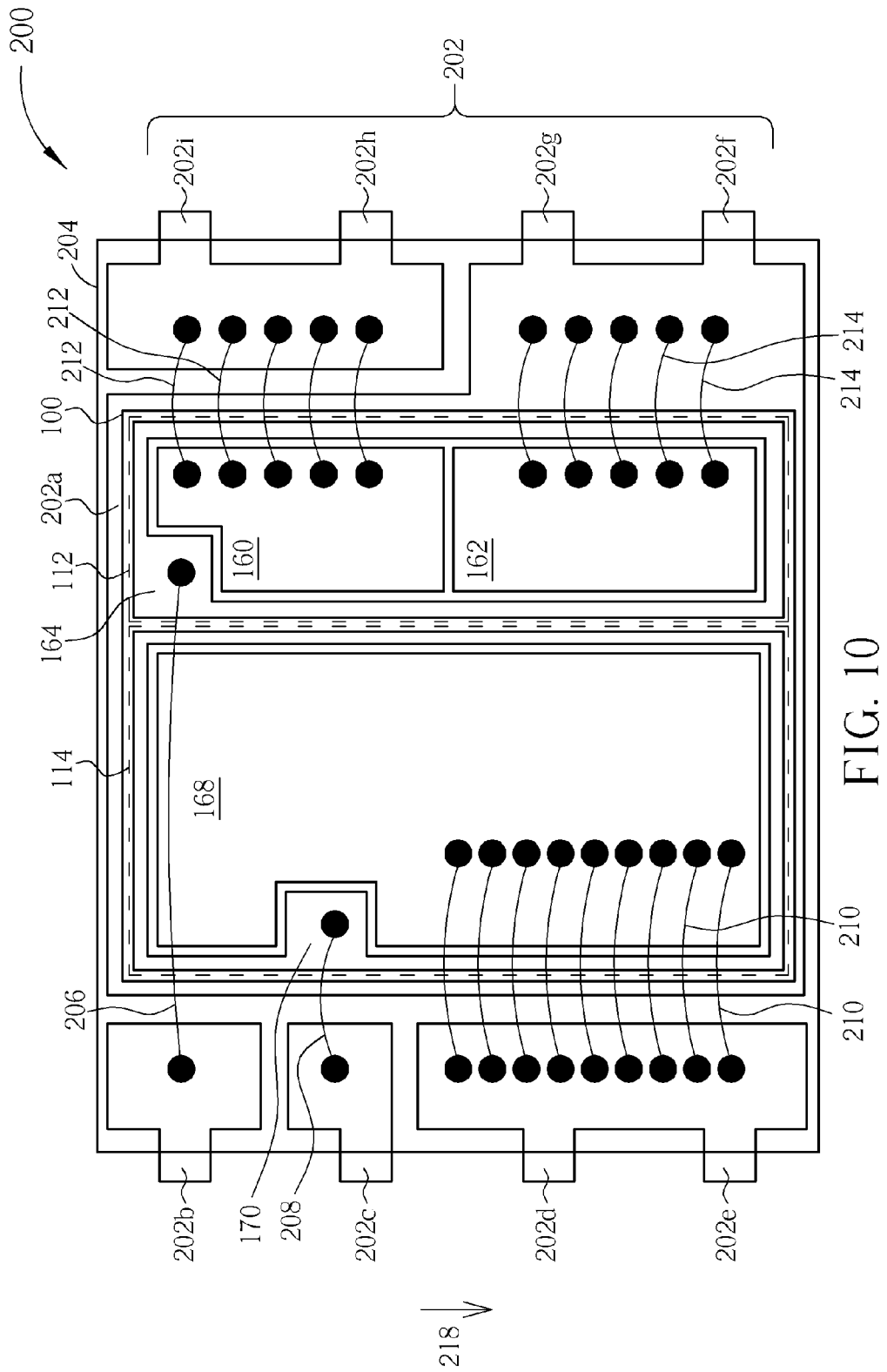
FIG. 10 illustrates another variant of a package structure according to a first exemplary embodiment of the present invention.

The third conductive component 210, the fourth conductive component 212, and the fifth conductive component 214 are not limited to be metal plates and could be other kinds of conductive components. Please refer to FIG. 9 and FIG. 10. FIG. 9 illustrates a variant of a package structure according to the first exemplary embodiment according of the present invention. FIG. 10 illustrates another variant of a package structure according to the first exemplary embodiment of the present invention. As shown in FIG. 9, compared to the first exemplary embodiment, in this variant, the third conductive component 210, the fourth conductive component 212, and the fifth conductive component 214 may be metal ribbons that include aluminum, but not limited thereto. As shown in FIG. 10, compared to the first exemplary embodiment, in this variant, the third conductive component 210, the fourth conductive component 212, and the fifth conductive component 214 may be a plurality of metal wires respectively.

Figure 11:
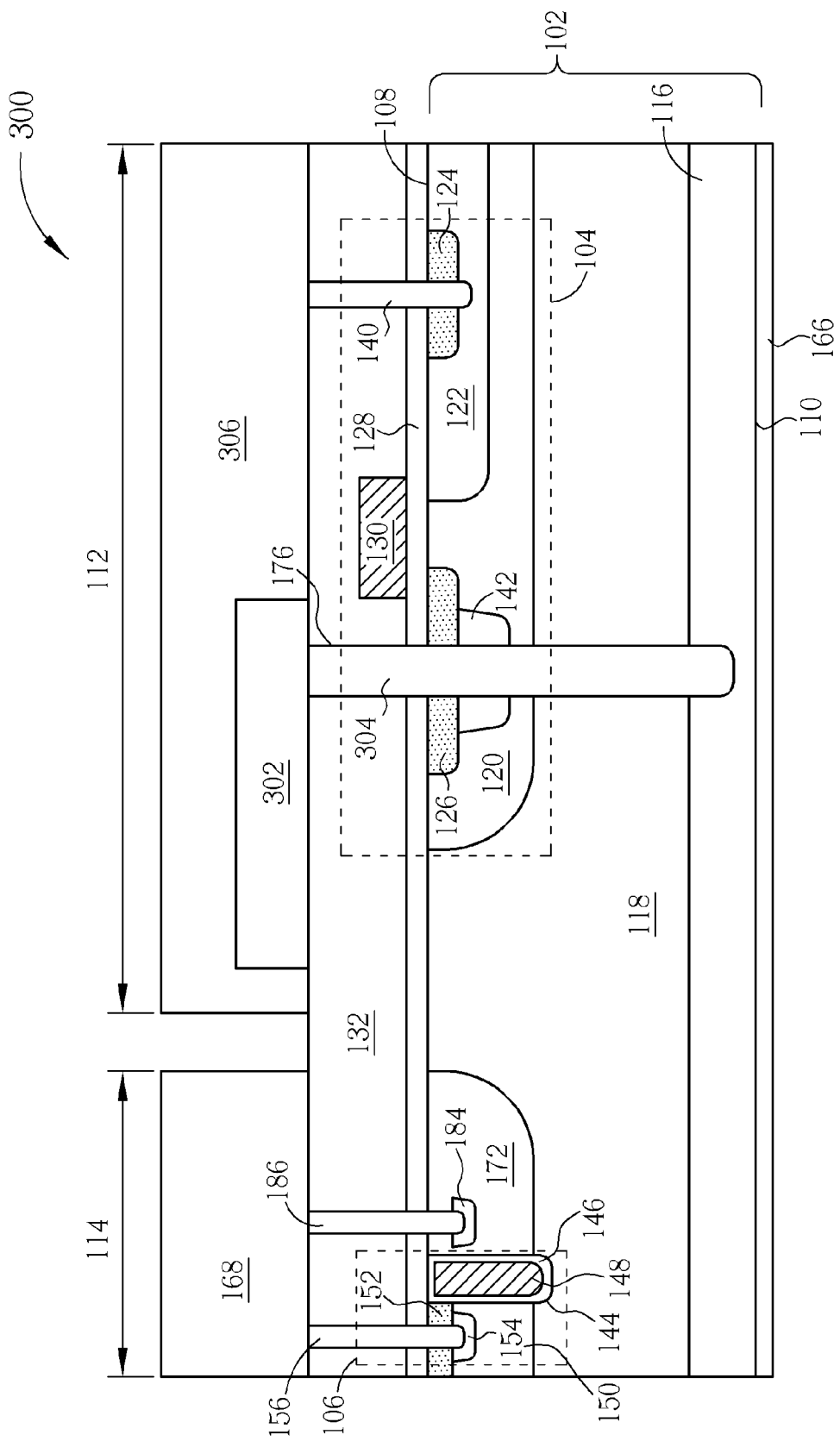
FIG. 11 is a cross-sectional view of a semiconductor device according to a second exemplary embodiment of the present invention.

In addition, the N-type doped high-side source region of the present invention is not limited to be electrically connected to the N-type semiconductor substrate by means of the high-side source metal layer and the first contact plug. Please refer to FIG. 11. FIG. 11 is a cross-sectional view of a semiconductor device according to a second exemplary embodiment of the present invention. Same components are denoted by same numerals as the first exemplary embodiment in the following exemplary embodiments, and same structures are not redundantly detailed. As shown in FIG. 11, compared to the first exemplary embodiment, the semiconductor device 300 of this exemplary embodiment excludes the high-side source metal layer 162 and the first contact plug 136 used for electrically connecting the doped high-side source region 126 to the semiconductor substrate 102, and a second interlayer dielectric layer 302 of this exemplary embodiment totally covers a second contact plug 304 for electrically insulating the second contact plug 304 from a high-side drain metal layer 306. Accordingly, the area of the high-side drain metal layer 306 could be larger than the area of the high-side drain metal layer 160 of the first exemplary embodiment, and the second contact plug 304 of the present invention penetrates through the second P-type doped contact region 142, the P-type doped high-side base region 120 and the N-type epitaxial layer 118, so that the N-type doped high-side source region 126 can be electrically connected to the semiconductor substrate 102, and the source of the high-side transistor device 104 could be electrically connected to the drain of the low-side transistor device 106. Furthermore, in this exemplary embodiment, the depth of the second contact plug 304 is deeper than the depth of the third contact plug 140. As compared with the first embodiment, the manufacturing method of the semiconductor device according to this exemplary embodiment includes performing a photolithography and etching process with a tenth photomask to further etch the second contact hole 176 between the step of forming the doped contact region and the step of forming the contact plug, so that the second contact hole 176 penetrates through the second P-type doped contact region 142, the P-type doped high-side base region 120 and the N-type epitaxial layer 118 and extends into the N-type substrate 116. Then, a contact plug process could be performed to form the second contact plug 304. Consequently, the second contact plug 304 not only penetrates through the second P-type doped contact region 142, the P-type doped high-side base region 120 and the N-type epitaxial layer 118, but also penetrates through the first interlayer dielectric layer 132, the first insulating layer 128 and the N-type doped high-side source region 126. Specifically, the second contact plug 304 is not limited to penetrate through the N-type epitaxial layer 118, in this exemplary embodiment, the second contact plug 304 may only contact with the epitaxial layer 118 without penetration.

Figure 12:
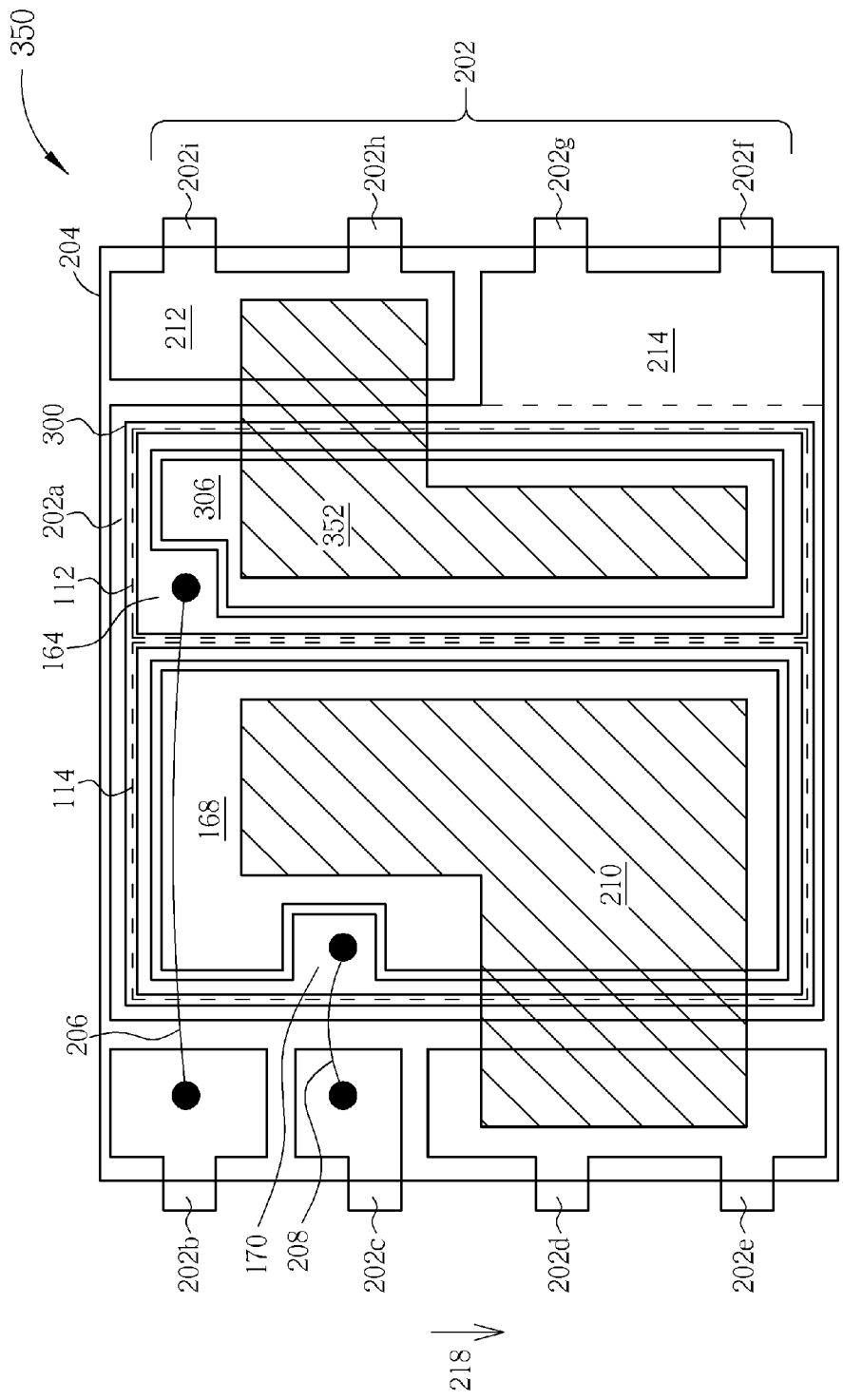
FIG. 12 is a top-view illustrating a package structure of a semiconductor device according to a second exemplary embodiment of the present invention.

The present invention further provides another package structure of the semiconductor device according to the second exemplary embodiment. Please refer to FIG. 12. FIG. 12 is a top-view illustrating a package structure of a semiconductor device according to a second exemplary embodiment of the present invention. As shown in FIG. 12, compared to the first exemplary embodiment, the semiconductor device 300 of this exemplary embodiment excludes the high-side source metal layer 162, and the fifth conductive component 214 is not included in the package structure 350 of the semiconductor device 300 according to this exemplary embodiment. Furthermore, the area of the high-side drain metal layer 306 could be larger than the area of the high-side drain metal layer 160 of the first exemplary embodiment, so that the area of a fourth conductive component 352 being in contact with the high-side drain metal layer 306 is larger than the area of the fourth conductive component 212 being in contact with the high-side drain metal layer 160 of the first exemplary embodiment, and the resistance between the drain of the high-side transistor device 104 and the input terminal Vin could be decreased.

Figure 13:
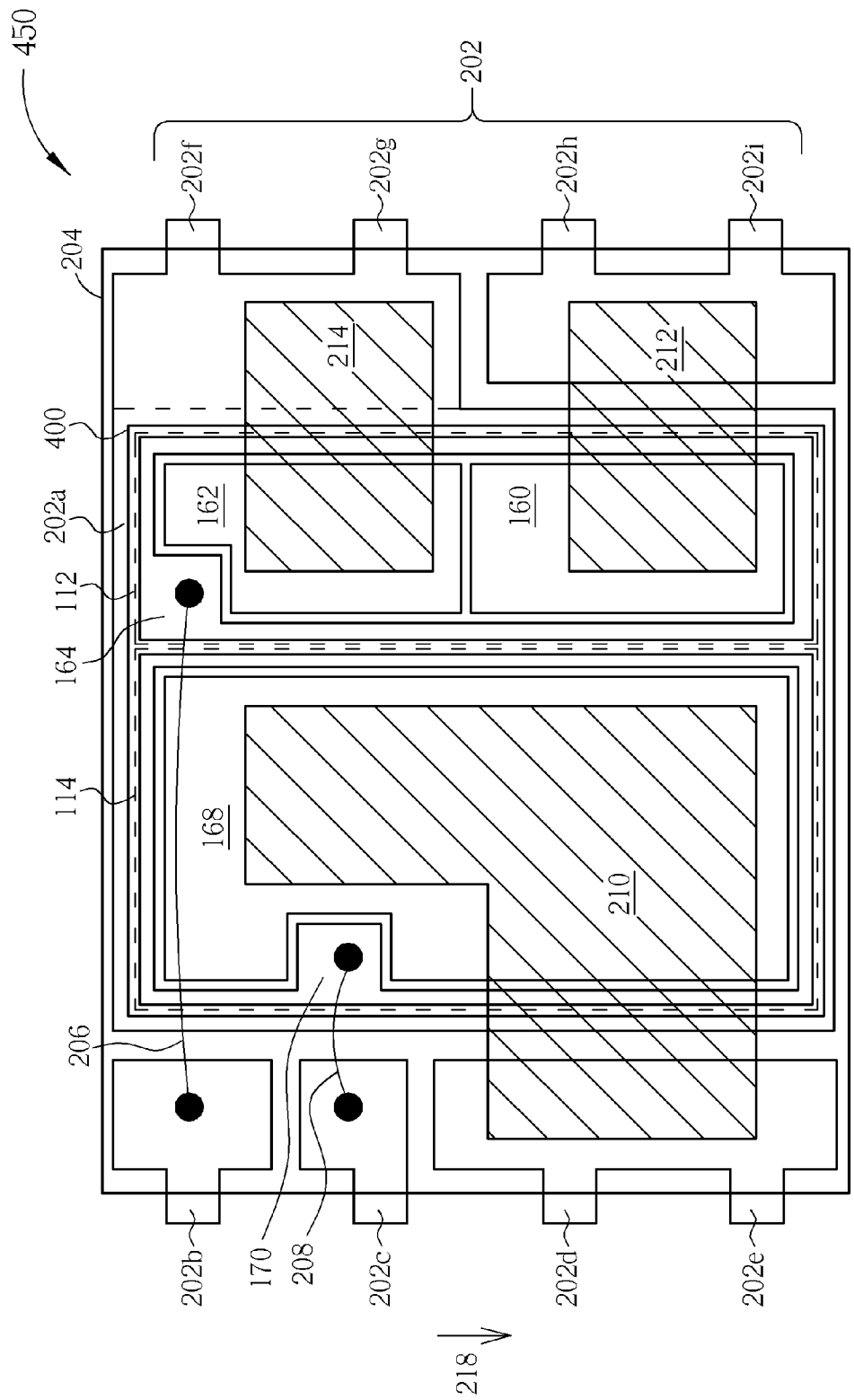
FIG. 13 is a top-view illustrating a package structure of a semiconductor device according to a third exemplary embodiment of the present invention.

In addition, the structure of the lead frame is not limited to the structures of the previous exemplary embodiments. Please refer to FIG. 13. FIG. 13 is a top-view illustrating a package structure of a semiconductor device according to a third exemplary embodiment of the present invention. As shown in FIG. 13, compared to the first exemplary embodiment, the fifth lead 202f, the sixth lead 202g, the seventh lead 202h, and the eighth lead 202i in the package structure 450 of the semiconductor device 400 according to this exemplary embodiment are arranged along a direction reverse to the direction of the first exemplary embodiment. That is to say, the fifth lead 202f, the sixth lead 202g, the seventh lead 202h, and the eighth lead 202i are arranged along the first direction 218 in sequence, and the fifth lead 202f, the sixth lead 202g are still connected to the chip holder 202a. It is appreciated that, for electrically connecting the high-side source metal layer 162 to the common metal layer 166, the arrangement of the high-side source metal layer 162 and the high-side drain metal layer 160 in the semiconductor device 400 according to the third exemplary embodiment is also contrary to the arrangement of the first exemplary embodiment. That is to say, the high-side source metal layer 162 and the high-side drain metal layer 160 are arranged along the first direction 218 sequentially in this exemplary embodiment. Consequently, the fifth lead 202f and the sixth lead 202g standing for the source lead of the high-side transistor device 104, and the first lead 202b standing for the gate lead of the high-side transistor device 104 are disposed at the same side of the package 204 for shortening the distance between the source lead and the gate lead of the high-side transistor device 104 and further lowering the resistance and the inductance electrically connected in series between the source lead and the gate lead to prevent the gate of the high-side transistor device 104 from time delay when receiving signals.

Figure 14:
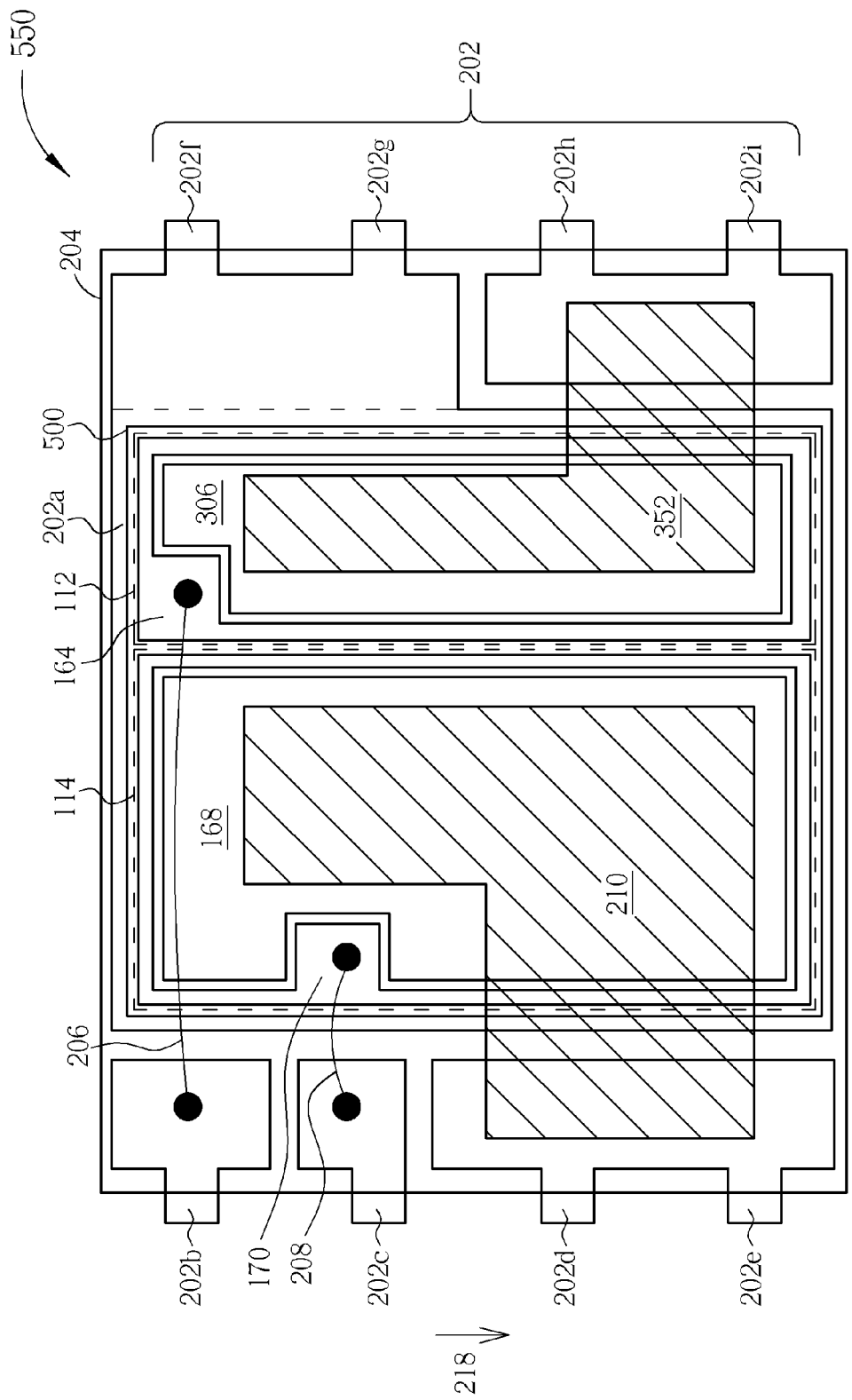
FIG. 14 is a top-view illustrating a package structure of a semiconductor device according to a fourth exemplary embodiment of the present invention.

The present invention also provides a package structure including the lead frame according to the third exemplary embodiment and the semiconductor device according to the second exemplary embodiment packaged thereon. Please refer to FIG. 14. FIG. 14 is a top-view illustrating a package structure of a semiconductor device according to a fourth exemplary embodiment of the present invention. As shown in FIG. 14, compared to the third exemplary embodiment, the semiconductor device 500 of this exemplary embodiment excludes the high-side source metal layer 162, so that the fifth conductive component 214 is not included in the package structure 550 of the semiconductor device 500 according to this exemplary embodiment. Furthermore, the area of the high-side drain metal layer 306 could be larger than the area of the high-side drain metal layer 160 of the third exemplary embodiment, so that the area of the fourth conductive component 352 being in contact with the high-side drain metal layer 306 is larger than the area of the fourth conductive component 212 being in contact with the high-side drain metal layer 160 of the third exemplary embodiment, and the resistance between the drain of the high-side transistor device 104 and the input terminal Vin could be decreased.

In conclusion, the semiconductor device of the present invention includes the high-side transistor device and the low-side transistor device fabricated on the same semiconductor substrate, and the source of the high-side transistor device and the drain of the low-side transistor device could be electrically connected by the contact plug, so that the high-side transistor device and the low-side transistor device serving as the converter could be integrated with each other. Accordingly, only one chip holder is required to dispose the semiconductor device in the package structure, so that the area of the semiconductor substrate or the sizes of the high-side transistor device and the low-side transistor device could be increased in the semiconductor device disposed on the chip holder. For this reason, the turn-on resistance between the drain and the source of the high-side transistor device and the turn-on resistance between the drain and the source of the low-side transistor device can be decreased, and the power loss during power supply conversion can be reduced. Moreover, in the package structure of the semiconductor device according to the present invention, the seventh lead and the eighth lead electrically connected to the input terminal, and the fifth lead and the sixth lead adjacent to the output terminal are disposed at the same side of the chip holder, and therefore, the resistance, the inductance and the capacitance electrically connected in series between the input terminal and the output terminal can be lowered to raise the voltage conversion efficiency of the package structure of the semiconductor device.

Those skilled in the art will readily observe that numerous modifications and alterations of the device and method may be made while retaining the teachings of the invention.

What is claimed is:

1. A semiconductor device integrated with a converter, comprising:
   a semiconductor substrate, having a first conductive type, wherein the semiconductor substrate has a high-side transistor device region and a low-side transistor device region;
   at least a high-side transistor device, disposed in the high-side transistor device region, the high-side transistor device comprising:
      a doped high-side base region, embedded in the semiconductor substrate of the high-side transistor device region, and the doped high-side base region having a second conductive type;
      a light-doped drain region, embedded in the doped high-side base region, and the light-doped drain region having the first conductive type;
      a doped drain region, disposed within the light-doped drain region, and the doped drain region having the first conductive type;
      a doped high-side source region, embedded in the doped high-side base region at a side of the light-doped drain region, and the doped high-side source region having a first conductive type; and
      a high-side gate conductive layer, disposed on the doped high-side base region between the light-doped drain region and the doped high-side source region;
   a high-side drain metal layer, disposed on the semiconductor substrate of the high-side transistor device region, and the high-side drain metal layer being electrically connected to the doped drain region;
   a high-side gate metal layer, disposed on the semiconductor substrate of the high-side transistor device region, and the high-side gate metal layer being electrically connected to the high-side gate conductive layer;
   a common metal layer, disposed under the semiconductor substrate, wherein the common metal layer electrically connects the doped high-side source region and the semiconductor substrate;
   at least a low-side transistor device, disposed in the low-side transistor device region, and the low-side transistor device comprising:
      a gate;
      a doped low-side base region, embedded in the semiconductor substrate of the low-side transistor device region, and the doped low-side base region having a second conductive type; and
      a doped low-side source region, embedded in the doped low-side base region, and the doped low-side source region having a first conductive type and serving as a source of the low-side transistor device, wherein the semiconductor substrate serves as a drain of the low-side transistor device;
   a low-side source metal layer, disposed on the semiconductor substrate of the low-side transistor device region, and the low-side source metal layer being electrically connected to the source of the low-side transistor device;
   a low-side gate metal layer, disposed on the semiconductor substrate of the low-side transistor device, and the low-side gate metal layer being electrically connected to the gate of the low-side transistor device; and
   a first interlayer dielectric layer, disposed between the semiconductor substrate and the high-side drain metal layer and between the semiconductor substrate and the low-side source metal layer.

2. The semiconductor device according to claim 1, further comprising a high-side source metal layer, disposed on the first interlayer dielectric layer of the high-side transistor device region, wherein the high-side source metal layer electrically connects the semiconductor substrate to the doped high-side source region.

3. The semiconductor device according to claim 2, further comprising:
   a first contact plug, penetrating through the first interlayer dielectric layer, wherein the first contact plug electrically connects the high-side source metal layer to the semiconductor substrate; and
   at least a second contact plug, penetrating through the first interlayer dielectric layer and the doped high-side source region, wherein the second contact plug electrically connects the high-side source metal layer to the doped high-side source region.

4. The semiconductor device according to claim 3, further comprising a third contact plug passing through the first interlayer dielectric layer and the doped drain region, wherein the third contact plug electrically connects the high-side drain metal layer, the doped drain region and the light-doped drain region.

5. The semiconductor device according to claim 4, further comprising a second interlayer dielectric layer disposed on the first interlayer dielectric layer, wherein the second interlayer dielectric layer electrically insulates the high-side drain metal layer from the first contact plug and the second contact plug, and the second interlayer dielectric layer electrically insulates the high-side source metal layer from the third contact plug.

6. The semiconductor device according to claim 1, further comprising:
   at least a second contact plug, penetrating through the first interlayer dielectric layer, the doped high-side source region and the doped high-side base region, wherein the second contact plug electrically connects the doped high-side source region to the semiconductor substrate; and
   a third contact plug, penetrating through the first interlayer dielectric layer and the doped drain region, wherein the third contact plug electrically connects the high-side drain metal layer to the doped drain region and the light-doped drain region.

7. The semiconductor device according to claim 6, further comprising a second interlayer dielectric layer disposed between the second contact plug and the high-side drain metal layer for electrically insulating the high-side drain metal layer and the second contact plug.

8. The semiconductor device according to claim 6, wherein a depth of the second contact plug is more than a depth of the third contact plug.

9. The semiconductor device according to claim 1, further comprising at least a doped contact region, disposed at a side of the doped high-side base region in the semiconductor substrate, wherein the doped contact region is electrically connected to the high-side source metal layer, and the doped contact region has the second conductive type.

10. The semiconductor device according to claim 1, wherein the semiconductor substrate in the low-side transistor device region has at least a trench, and the low-side transistor device further comprises:
    an insulating layer, covering the semiconductor substrate in the trench; and
    a low-side gate conductive layer, disposed in the trench and the low-side gate conductive layer serving as the gate of the low-side transistor device.

11. The semiconductor device according to claim 1, wherein a depth of the doped high-side base region is substantially the same as a depth of the doped low-side base region.

12. A package structure of a semiconductor device integrated with a converter, comprising:
    a lead frame comprising:
        a chip holder, having a first side and a second side disposed oppositely to the first side;
        a first lead, disposed at the first side of the chip holder;
        a second lead, disposed at the first side of the chip holder;
        a third lead, disposed at the first side of the chip holder;
        a forth lead, disposed at the first side of the chip holder, and the third lead and the forth lead being electrically connected to the chip holder;
        a fifth lead, disposed at the second side of the chip holder;
        a sixth lead, disposed at the second side of the chip holder, and the sixth lead-pin being electrically connected to the fifth lead;
        a seventh lead, disposed at the second side of the chip holder; and
        an eighth lead, disposed at the second side of the chip holder, and the eighth lead being electrically connected to the seventh lead;
    a semiconductor device disposed on the lead frame comprising:
        a semiconductor substrate, having a first conductive type, wherein a high-side transistor device region and a low-side transistor device region are defined on the semiconductor substrate;
        at least a high-side transistor device, disposed in the high-side transistor device region, the high-side transistor device comprising:
            a doped high-side base region, embedded in the semiconductor substrate of the high-side transistor device region, and the doped high-side base region having a second conductive type;
            a light-doped drain region, embedded in the doped high-side base region, and the light-doped drain region having the first conductive type;
            a doped drain region, disposed within the light-doped drain region, and the doped drain region having the first conductive type;
            a doped high-side source region, embedded in the doped high-side base region at a side of the light-doped drain region, and the doped high-side source region having a first conductive type; and
            a high-side gate conductive layer, disposed on the doped high-side base region between the light-doped drain region and the doped high-side source region;
        a high-side drain metal layer, disposed on the semiconductor substrate of the high-side transistor device region, and the high-side drain metal layer being electrically connected to the doped drain region;
        a high-side gate metal layer, disposed on the semiconductor substrate of the high-side transistor device region, and the high-side gate metal layer being electrically connected to the high-side gate conductive layer;
        a common metal layer, disposed under the semiconductor substrate, wherein the common metal layer electrically connects the doped high-side source region and the semiconductor substrate;
        at least a low-side transistor device, disposed in the low-side transistor device region, and the low-side transistor device comprising:
            a gate;
            a doped low-side base region, embedded in the semiconductor substrate of the low-side transistor device region, and the doped low-side base region having a second conductive type; and
            a doped low-side source region, embedded in the doped low-side base region, and the doped low-side source region having a first conductive type and serving as a source of the low-side transistor device, wherein the semiconductor substrate serves as a drain of the low-side transistor device;
        a low-side source metal layer, disposed on the semiconductor substrate of the low-side transistor device region, and the low-side source metal layer being electrically connected to the source of the low-side transistor device;
        a low-side gate metal layer, disposed on the semiconductor substrate of the low-side transistor device region, and the low-side gate metal layer being electrically connected to the gate of the low-side transistor; and
        a first interlayer dielectric layer, disposed between the semiconductor substrate and the high-side drain metal layer and between the semiconductor substrate and the low-side source metal layer; and
    a package, encapsulating the semiconductor device and a portion of the lead frame.

13. The package structure of a semiconductor device according to claim 12, further comprising a first conductive component, a second conductive component, a third conductive component, and a fourth conductive component, wherein the first conductive component electrically connects the high-side gate metal layer to the first lead, the second conductive component electrically connects the low-side gate metal layer to the second lead, the third conductive component electrically connects the low-side source metal layer to the third lead and the fourth lead, and the fourth conductive component electrically connects the high-side drain metal layer to the seventh lead and the eighth lead.

14. The package structure of a semiconductor device according to claim 13, wherein the first conductive component and the second conductive component are metal wires.

15. The package structure of a semiconductor device according to claim 13, wherein the third conductive component and the fourth conductive component are metal ribbons.

16. The package structure of a semiconductor device of claim 13, wherein the third conductive component and the fourth conductive component are metal plates.

17. The package structure of a semiconductor device of claim 13, wherein the third conductive component and the fourth conductive component are a plurality of metal wires.

18. The package structure of a semiconductor device of claim 13, further comprising a high-side source metal layer, disposed on the first interlayer dielectric layer in the high-side transistor device region, wherein the high-side source metal layer electrically connects the semiconductor substrate to the doped high-side source region.

19. The package structure of a semiconductor device of claim 18, further comprising a fifth conductive component, wherein the fifth conductive component electrically connects the high-side source metal layer to the fifth lead and the sixth lead.

20. The package structure of a semiconductor device of claim 12, wherein the first lead, the second lead, the third lead and the fourth lead are arranged sequentially along a direction, and the eighth lead, the seventh lead, the sixth lead and the fifth lead are arranged sequentially along the direction.

21. The package structure of a semiconductor device of claim 12, wherein the first lead, the second lead, the third lead and the fourth lead are arranged sequentially along a direction, and the eighth lead, the seventh lead, the sixth lead and the fifth lead are arranged sequentially along another direction reverse to the direction.

\* \* \* \* \*